United States Patent [19]

Merlina et al.

[11] 4,236,777
[45] Dec. 2, 1980

[54] INTEGRATED CIRCUIT PACKAGE AND MANUFACTURING METHOD

[75] Inventors: Joseph F. Merlina, Harrisburg; John P. Redmond, Mechanicsburg; George Ulbrich; Richard M. Wagner, both of Harrisburg, all of Pa.

[73] Assignee: AMP Incorporated, Harrisburg, Pa.

[21] Appl. No.: 61,553

[22] Filed: Jul. 27, 1979

[51] Int. Cl.³ .............................................. H05K 1/11
[52] U.S. Cl. ................................ 339/17 CF; 29/848; 156/630; 174/52 FP
[58] Field of Search .................. 264/272; 339/17 CF, 339/75 M; 29/848, 846; 174/52 FP, 68.5; 361/406; 156/629, 630, 631, 634, 661.1

[56] References Cited

U.S. PATENT DOCUMENTS

| | | | |
|---|---|---|---|
| 2,692,190 | 10/1954 | Pritkin | 156/630 |
| 3,013,188 | 12/1961 | Kohler | 361/406 |
| 3,039,177 | 6/1962 | Burdett | 29/848 |
| 3,335,327 | 8/1967 | Damon et al. | 317/101 |
| 3,409,861 | 11/1968 | Barnes et al. | 339/17 CF |
| 3,440,027 | 4/1969 | Hugle | 174/52 FP |
| 3,466,206 | 9/1969 | Beck | 29/846 |
| 3,691,289 | 9/1972 | Rohloff | 174/52 PE |
| 3,963,315 | 6/1976 | Bonis | 339/17 CF |
| 3,972,062 | 7/1976 | Hopp | 357/68 |
| 4,035,046 | 7/1977 | Kloth | 339/17 CF |

FOREIGN PATENT DOCUMENTS 981797 1/1976 Canada ..................................... 174/68.5

Primary Examiner—John McQuade
Attorney, Agent, or Firm—Frederick W. Raring

[57] ABSTRACT

An integrated circuit package for establishing electrical contact with the terminal areas or pads of an integrated circuit chip comprises an insulating substrate having a flat surface in which there are embedded a plurality of electrodeposited conductors. The conductors have inner ends in a chip-receiving zone of the flat surface and have outer end portions which are remote from the chip-receiving zone. The inner ends of the conductors have contact bumps or promontories extending above the flat surface and located such that when a chip is placed on the promontories, they will be against the terminal areas of the chip. The chip can be held against the promontories by a suitable clamping means and contact established with the conductors at their outer ends by suitable connecting means. The device is particularly useful for testing chips prior to their being placed in service. The integrated circuit package is produced by etching depressions in a copper foil, electrodepositing conductors in the depressions and on the surface of the foil while controlling the locations of the conductors by suitable masking, molding the substrate against the foil so that the conductors are embedded in the substrate, and then etching away the copper foil.

8 Claims, 17 Drawing Figures

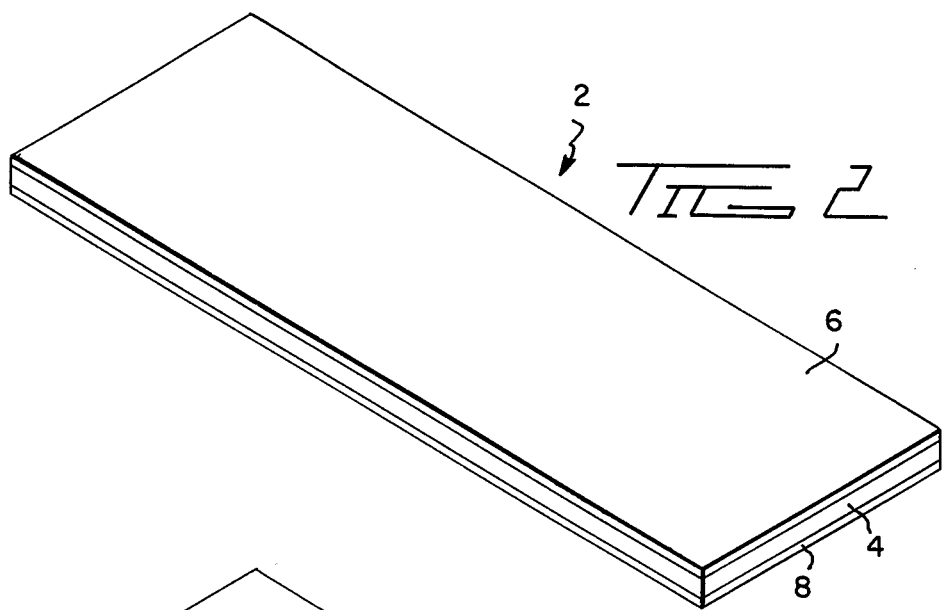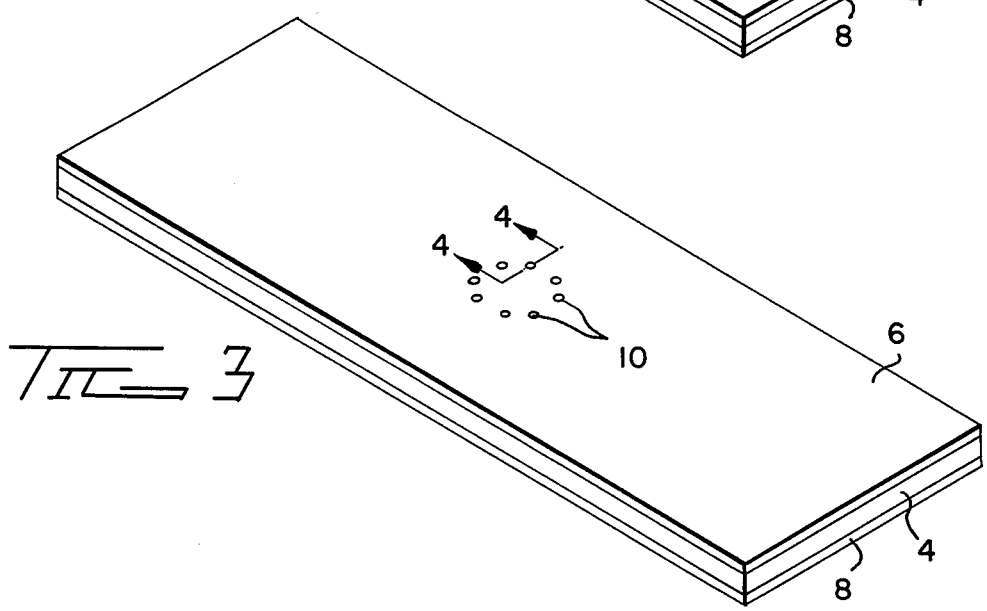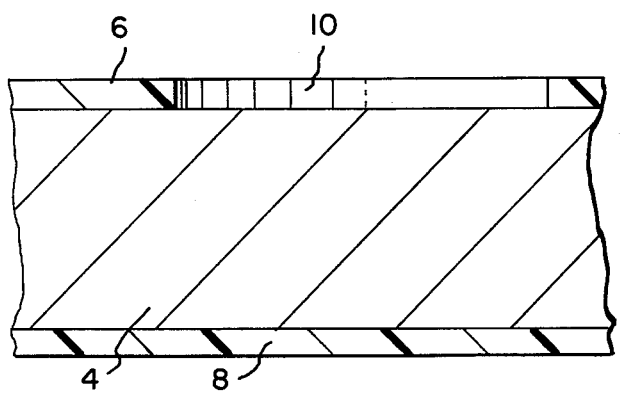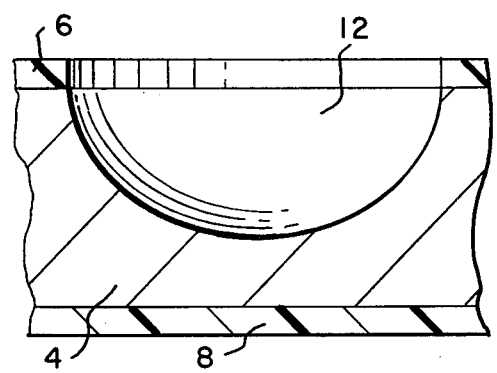

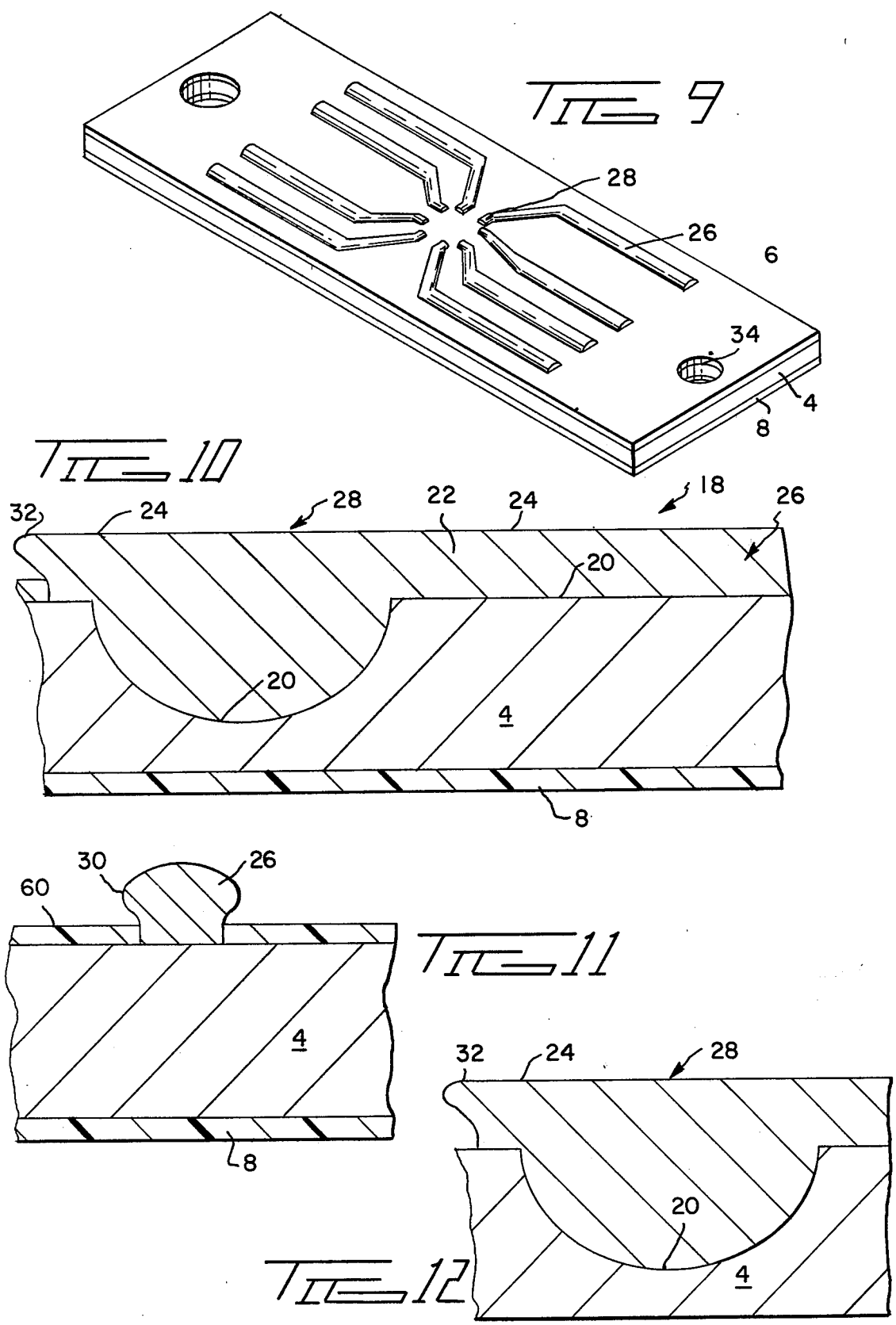

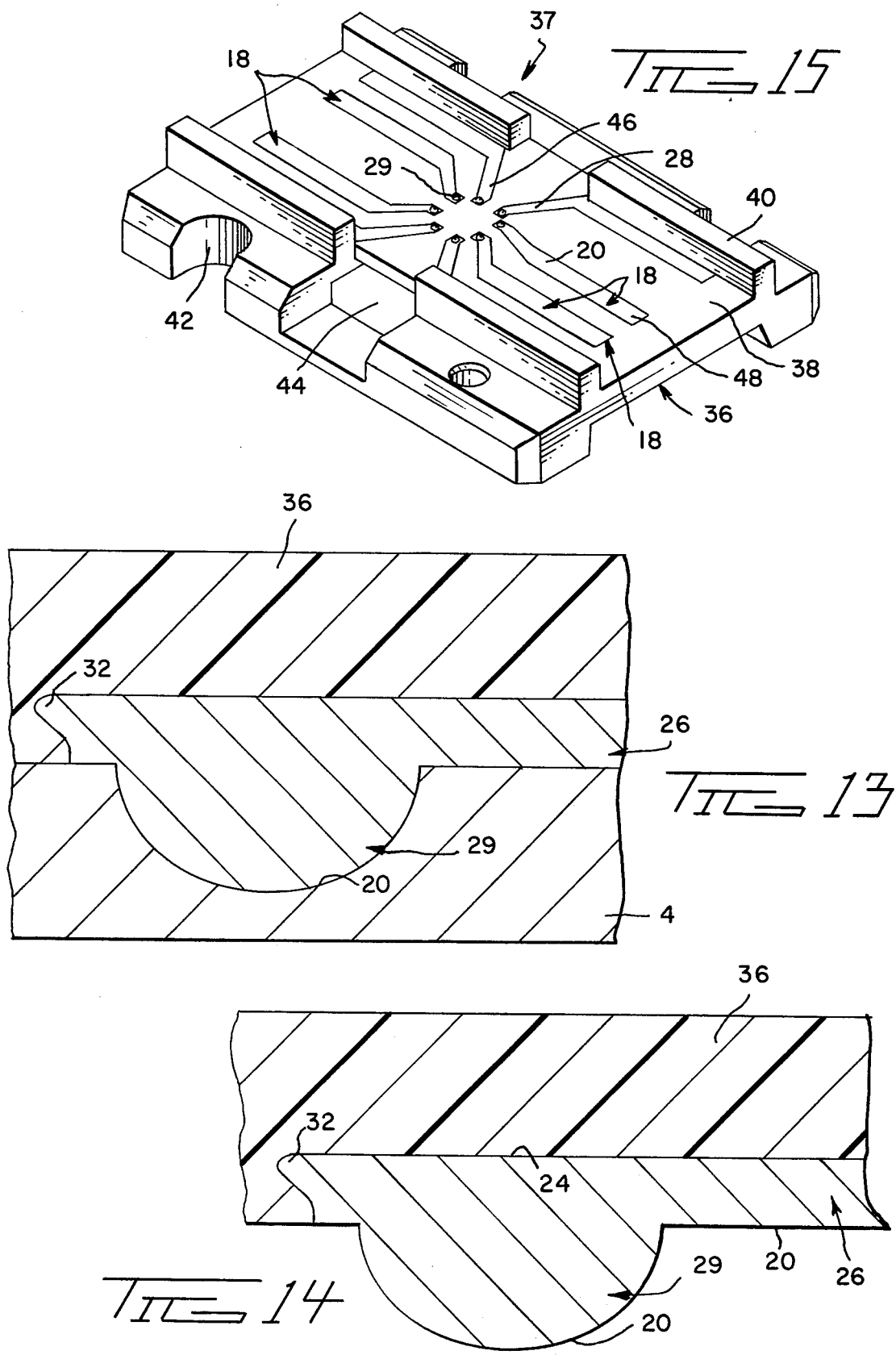

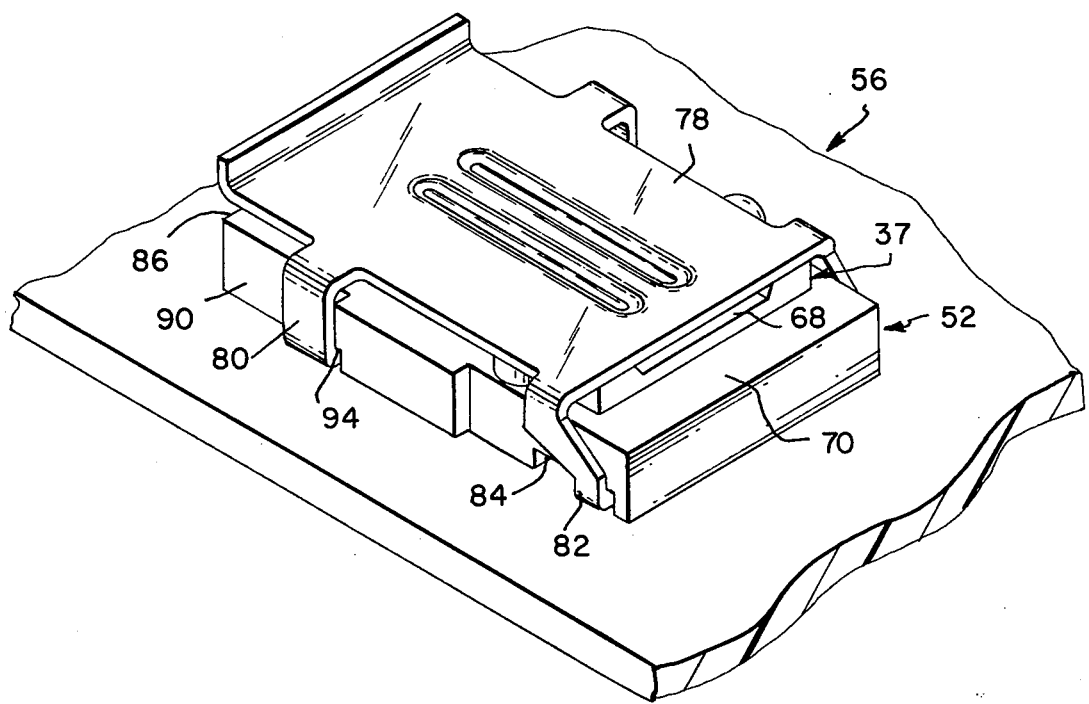
_Fig 11_

INTEGRATED CIRCUIT PACKAGE AND MANUFACTURING METHOD

FIELD OF THE INVENTION

This invention relates to integrated circuit packages and manfacturing methods for circuit packages. The embodiment of the invention described below is particularly intended for use in testing IC chips prior to their being placed in service, however, the principles of the invention can be used for other purposes such as permanent packages for IC chips.

BACKGROUND OF THE INVENTION

It is common practice in the electronics industry to subject integrated circuit chips to testing prior to their being placed in service and prior to their being encapsulated, or otherwise mounted, in an integrated circuit package having leads extending therefrom which connect the terminal areas of the chip to circuitry on a circuit board or the like. Such preliminary testing or "burning-in" is quite often used when the IC chip is to be employed in a critical circuit and under circumstances where its replacement, should it prove to be defective, would involve expensive reworking of the equipment in which it is installed. The IC packages used for these testing procedures can have conventional lead frames therein which require that the connections between the conductors of the package, the leads, and the terminal areas of the chip be made by wire bonding methods. This procedure is not desirable for the reason that the wires, which must be bonded to the chip for the testing operation, must later be removed from the chip and damage to the chip can result. It has been suggested that the IC package used for the testing process be provided with bumps or promontories on its leads so that the chip can be simply positioned against the bumps thereby to establish contact with the terminal areas. At the conclusion of the testing process, the chip can be easily removed from the IC test package and placed in service with full confidence in its future performance.

Attempts thus far to produce a package having such contact bumps thereon have not been highly successful for the reason that it is extremely difficult to produce the bumps or promontories on the ends of the conductors of the IC package. These bumps must be quite small, must be precisely located so that they will contact the terminal areas of the chip, and they must be of uniform height so that the chip will lie flat on a cluster of bumps with one bump in electrical contact with each terminal area of the chip. The present invention is directed to an improved integrated circuit package having contact promontories or bumps which satisfy all of these requirements.

An integrated circuit package in accordance with the invention comprises an insulating substrate of molded plastic material having a flat surface and having a plurality of electrodeposited conductors embedded therein with the surfaces of these conductors being coplanar with the flat surfaces. The inner ends of the conductors extend from a centrally located chip-receiving zone and generally spherical contact promontories or bumps are provided on these inner ends. The bumps or promonotories are of uniform height above the flat surface and they are precisely located so that a chip can be placed on the bumps and the bumps will be in contact with the terminal areas of the chip. The chip can be temporarily held on the package by means of a suitable clip and upon connecting the outer ends of the conductors to suitable test circuitry, the chip can be tested and then removed from the package and placed in service.

Integrated circuit packages in accordance with the invention are produced by etching hemispherical depressions in unmasked portions of one surface of an etchable metal, such as copper, having masking or resist material extending over the remainder of its surface. After etching of the depressions, the resist material is removed along paths which correspond to the paths of the conductors in the finished IC package. Thereafter, conductive metal is deposited against the copper in the unmasked portions of the etchable metal including the depressions. The masking material is then totally removed. Molding material is then molded against the etchable metal surface so that the conductors are embedded in the molding material which forms the substrate. Finally, the etchable metal is etched away leaving a flat surface on the substrate in which the conductors are embedded with the bumps projecting above this flat surface as hemispherical projections.

DESCRIPTION OF THE DRAWING

FIG. 2 is a perspective view of a blank comprising copper foil having resist material on both of its surfaces.

FIG. 3 is a view of the blank having openings in the resist material on one of its surfaces.

FIG. 4 is a cross-sectional view through one of the openings shown in FIG. 3.

FIG. 5 is a view similar to FIG. 4 after etching of the hemispherical depressions.

FIG. 9 is a view similar to FIG. 7 but showing the blank after electrodeposition of conductive metal against the copper foil.

FIGS. 10 and 11 are cross-sectional views showing the cross sections of the electrodeposited conductors.

FIG. 12 is a view similar to FIG. 10 illustrating the removal of the resist material from the copper foil.

FIG. 13 is a view similar to FIG. 12 illustrating the step of molding the substrate against the copper foil.

FIG. 14 is a view similar to FIG. 13 illustrating the removal of the copper foil by etching.

FIG. 15 is a perspective view of the completed IC package.

FIG. 17 is a perspective view of the parts assembled.

PRACTICE OF THE INVENTION

Figure 16:
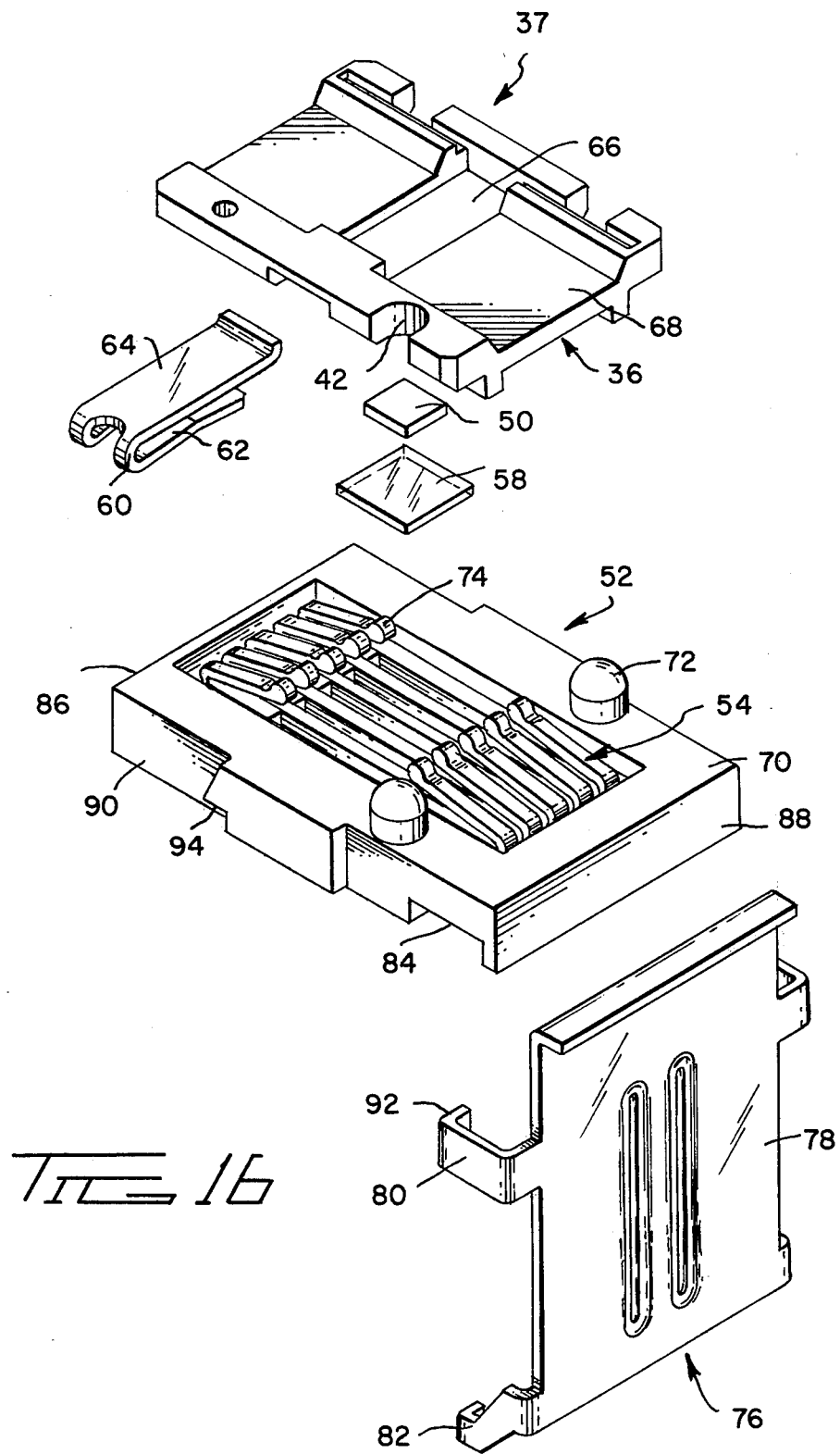
FIG. 16 is a perspective exploded view showing the parts of a circuit package.

A complete integrated package assembly in accordance with the invention as shown in FIGS. 16 and 17 comprises a chip support 37 on which an integrated chip is mounted and by means of which contact is established with the terminal areas of the chip. In the description which follows, the chip support and the method of manufacturing this chip support will first be described and the manner of using the chip support in the testing assembly of FIGS. 16 and 17 will then be described.

The chip support 37 comprises a generally rectangular molded substrate 36 of suitable insulating material such as epoxy resin (if high temperature properties are required) or alternatively a thermoplastic material such as a nylon composition. The substrate has a flat upper surface 38 from which locating ribs 40 project and has suitable recesses 42 in its side edges so that it can be mounted precisely on a connector shown in FIGS. 16 and 17. A plurality of electrodeposited conductors 18 are embedded in the substrate 36 and these conductors have flat upper surfaces which are coplanar with the surface 38 of the substrate. The conductors have inner ends 46 which are located in a chip-receiving zone of the surface 38 and have outer ends 48 which extend to locations adjacent to the ends of the substrate. Each of the inner ends 46 has a generally hemispherical bump or promontory 29 thereon, the diameter of which is less than the width of the terminal areas of the chip and these bumps are located relative to each other in positions corresponding to the locations of the terminal areas on the chip so that when the chip is positioned on the bumps, the bumps will be in electrical contact with the terminal areas. As will become apparent from the following description, these bumps are of uniform height above the surface 38 so that all of the terminal areas will be contacted when the chip is positioned on their upper ends. Other structural features of the chip support 37 will become apparent in the following description of the method of manufacturing this chip support.

Figure 1:
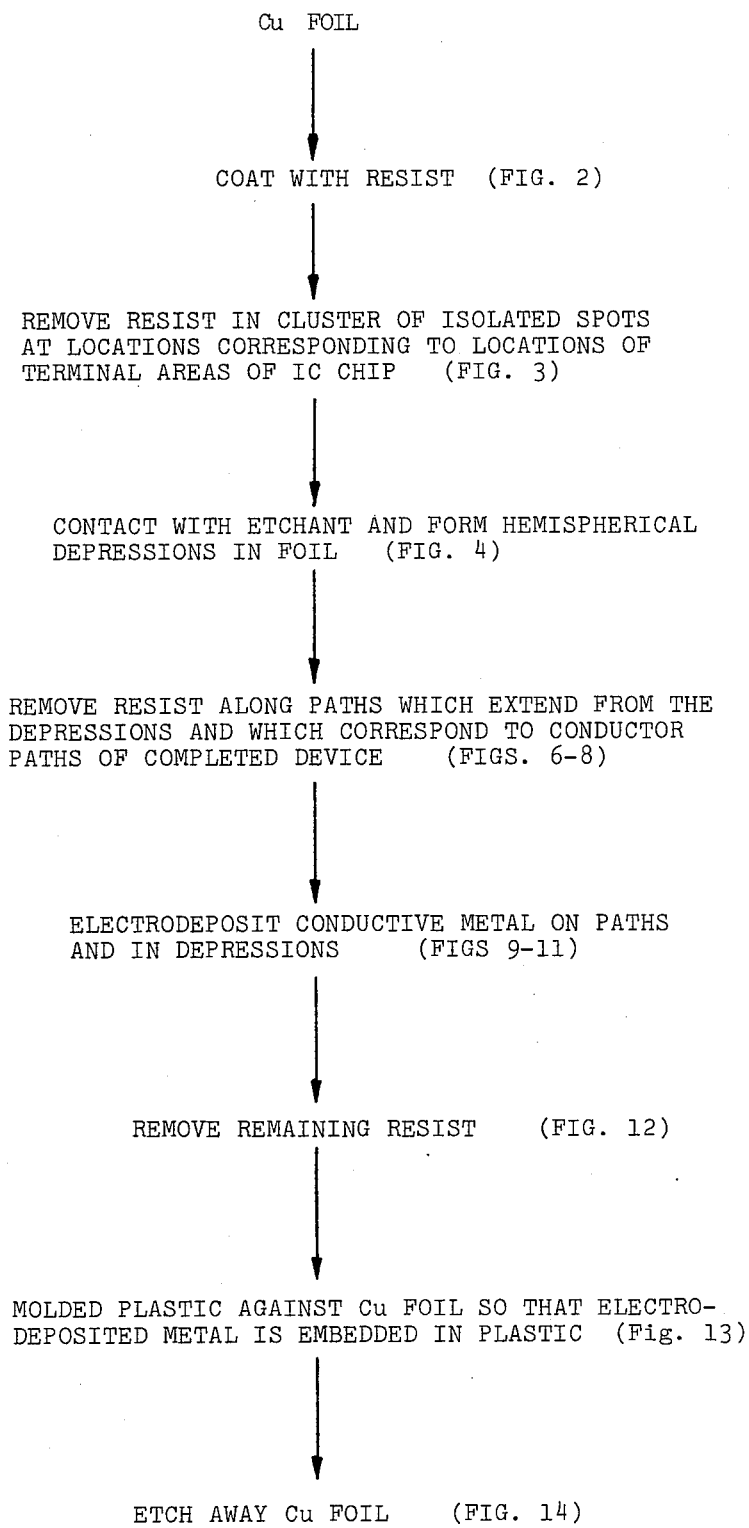
FIG. 1 is a flow chart setting forth in broad terms the process for producing IC packages in accordance with the invention.
Figure 6:
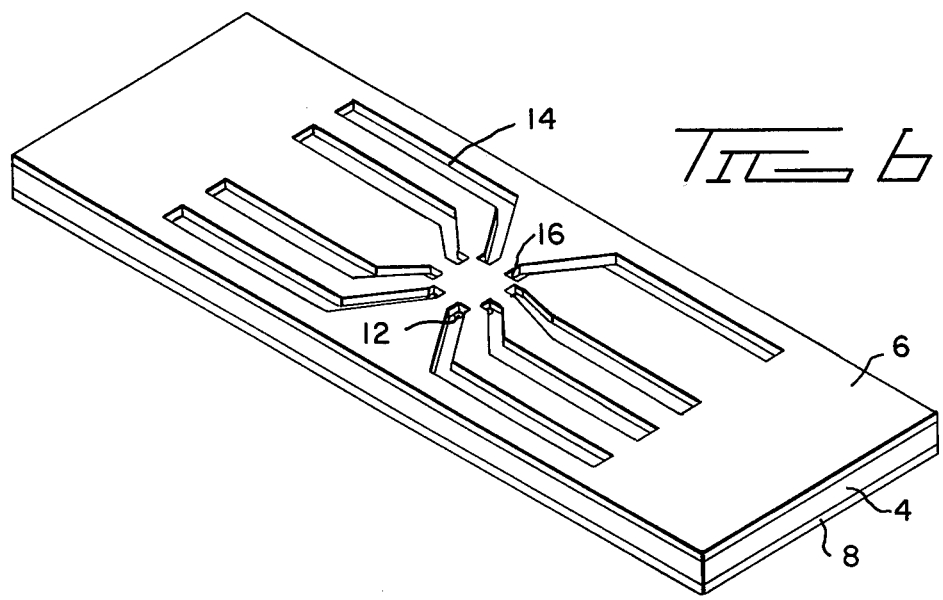
FIG. 6 is a view illustrating the blank after removal of resist along paths corresponding to the paths of the conductors in the IC package.
Figure 7:
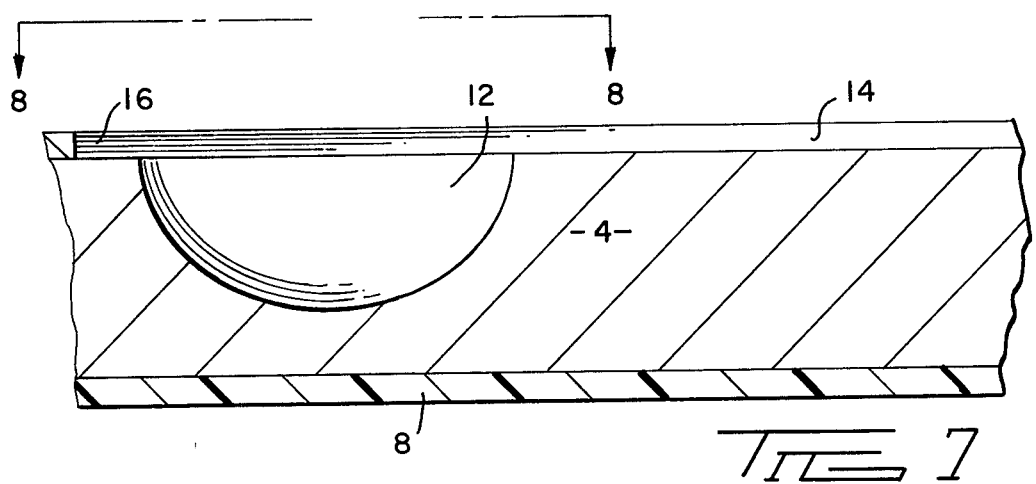
FIG. 7 is a fragmentary cross-sectional view taken along one of the paths.
Figure 8:
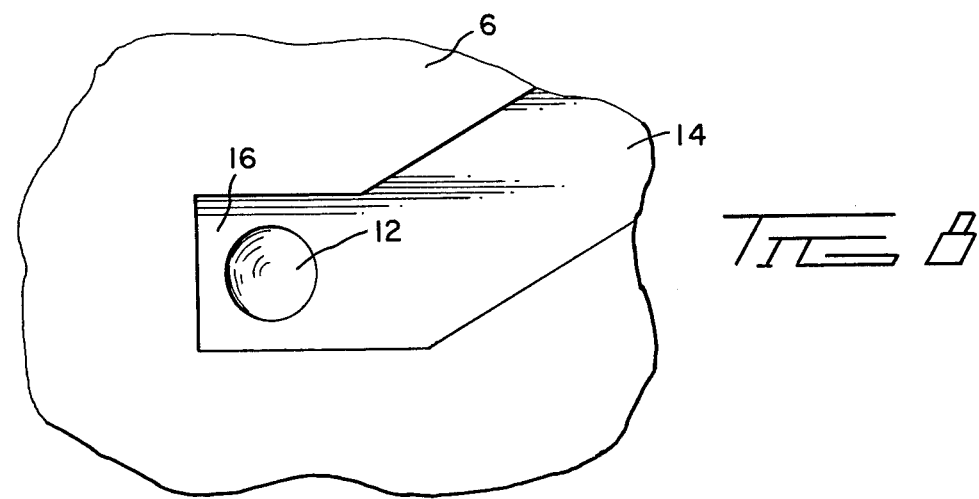
FIG. 8 is a plan view looking in the direction of the arrows 8—8 of FIG. 7.

FIG. 1 is a flow diagram of the essential steps required to produce the chip support in FIG. 15 and the descriptions of the process steps in FIG. 1 refer to FIGS. 2-15 which illustrate these manufacturing steps.

The chip support is produced with the aid of a blank 2, FIG. 2, comprising a section of copper foil 4 having a thickness of about 0.0015" and having resist coatings 6, 8 on its surface. The resist coating 6 on the upper surface is preferably a positive photo-sensitive liquid resist containing diazo compounds in a suitable polymer. This coating is applied by dipping the film in the liquid resist or otherwise applying the liquid to the surface of the copper foil and then baking to dry and harden the film. The resist can be selectively removed with the aid of a mask and exposing selected areas to light, developing the resist, and washing away the developed resist material. This exposing and developing process is carried out during the manufacturing process as described below. A number of commercially available photo-sensitive liquid resists can be used for the resist coating 6, such as AZ340 supplied by Shipley Company, Inc., of 2300 Washington Street, Newton, Mass. The same supplier provides a suitable developer under the trade name AZ303. The chip support is formed against the upper surface of the blank 2, as will be explained, and the lower surface of foil 4 is provided with the resist film 8 in order to protect this lower surface against attack by the etchant during the manufacturing process. The resist film 8 may be provided by laminating a film such as Riston 210 (supplied by DuPont Company, Photo Products Department, Wilmington, Del.) to the lower surface.

The first step in the manufacturing process is to provide openings 10 in the resist film 6 at locations corresponding to the desired locations of the promontories 29 on the ends 46 of conductors 18. These openings can be produced by placing a suitable mask in the form of a photographic negative against the film 6, exposing the masked surface to light, developing, and washing away the developed resist in the conventional manner.

After formation of the openings 10, the blank 2 is contacted with an etchant capable of attacking the copper 4, such as a ferric chloride solution, to produce hemispherical depressions or recesses 12, FIG. 5, in the copper 4. These recesses 12 will have a hemispherical form by virtue of the manner in which the copper is attacked by the etchant.

After formation of the recesses 12, the resist film 6 is removed along paths as shown at 14 (FIGS. 6 and 7) and in areas surrounding the recesses 12 as shown at 16, these paths corresponding to the paths of the conductors 18 in the finished support 32. Again, the resist 6 is removed by conventional masking, exposing, developing, and washing steps. The exposed copper including the paths 14, the recesses 12, and the areas 16 which surround the recesses is then covered with electrodeposited metal generally shown at 18 in FIGS. 10-15. This deposit is produced by first electrodepositing about 30 microinches of gold as shown at 20 on the surface of the copper foil 4 and on the surface of the recess 12. The thin gold plating which is electrodeposited in this step becomes the exposed gold surface of the conductors 18 of the finished support 37. After the thin plating 20 of gold has been deposited, about 900 microinches of nickel, as indicated at 26, are deposited on the gold platings 20. The thickness of this nickel plating will extend as shown in FIGS. 10 and 11 beyond the surface of the resist 6. Also, this electrodeposited nickel will tend to deposit outwardly from the paths above the resist 6 as shown at 30 and 32 thereby to form overhanging portions of the conductors which serve a keying purpose, as will be explained below, when the substrate 36 is molded against the conductors. These overhanging portions 30 and 32 are produced as a natural consequence of the electroforming process for the conductors.

After the 900 microinches of nickel have been electrodeposited, the surface of the nickel is then electroplated with a plating of about 30 microinches of gold, as shown at 24 in FIG. 10. This final gold plating does not serve an electrical contact purpose but is rather provided to protect the electrodeposited nickel against attack by an etchant while the copper 4 is being etched away, as will be described below.

It will thus be apparent that at the stage of the process shown in FIG. 9, the conductors 18 for the support 37 have been formed and each comprises electrodeposited metal 26 forming the straight line portions of the conductor paths, an electrodeposited metal 38 which forms the inner ends of the conductors. The inner ends have, at this stage, the hemispherical electroformed bumps thereon surrounded by the copper foil 4, as shown in FIG. 10. At this stage of the process, it is also desirable to form aligning holes 34 in the ends of the blank 2 for the purpose of positioning the blank during molding process. These holes 34 are formed by exposing and developing photoresist coating 6, washing and then etching the foil 4 to produce the holes.

As shown in FIG. 12, both of the resist coatings 6, 8 are removed after the conductors have been electroformed on the foil 4 and the foil with conductors thereon is then placed in a suitable mold and the molding material 36 is molded against the conductors 18 and against the upwardly facing surface of the foil 4. Thereafter, the foil with the molding material 36 molded against and on the conductors is contacted with an etchant, such as ferric chloride, which will attack the copper but not the gold plated surfaces of the conductors. The copper is then removed as shown in FIGS. 14 and 15. The finished support 37 thus has the surfaces of the conductors 18 coplanar with the surface 38 of the molded material and the conductors are embedded in the molding material 38 with the projecting portions 30, 32 serving as keying means which anchor the conductors in the molded substrate. As mentioned above, the total thickness of the conductors is about 960 microinches and the provision of these projecting portions 30, 32 is an important structural feature which serves to prevent removal of the conductors from the substrate.

FIGS. 16 and 17 show the manner in which an integrated circuit chip 50 can be tested or "burnt-in" by the use of a chip carrier 37 in accordance with the invention in conjunction with a connector 52 which is mounted on a printed circuit board 56. The connector 52 has terminals 54 therein which extend beyond the lower surface of the connector 52, through openings in the circuit board 56, and which are soldered to conductors on the underside of the circuit board. The terminals 54 have ends 74 which are normally located above the surface 70 of the connector and which contact the outer ends 48 of the conductors 18 of the chip carrier 37.

When the chip 50 is to be tested, it is positioned on the bumps 29 in the chip-receiving zone of the chip carrier 37 with the bumps in contact with the terminal areas of the IC chip. Thereafter, a plate 58 of insulating material, such as glass, is positioned on the chip 50 and a clip 60 is assembled to the substrate to hold the glass plate 58 and the chip 50 on the substrate. The clip 60 has one arm 62 which extends over the glass plate and another arm 64 which extends through the opening 44 and which is received in a recess 66 in the surface 68 of the substrate.

The chip carrier 37 is then positioned above the upper surface 70 of the connector 52 and properly located by means of integral locating bosses 72 which are received in the recesses 42 so that the ends of the conductors on the substrate will be against the contact ends 74 of the terminals 54. The substrate is then clamped against the connector 52 by means of a clamping member 76 which comprises a plate-like section 78 having pairs of legs 82, 80 extending from its side edges. The legs 82 are shaped such that they can be placed in recesses 84 in the sides of the substrate and the plate member 78 can be then swung downwardly until it is parallel to the surface 70 at which time the legs 80 will be located against side surface portions 90 of the connector 52 adjacent to the end 86 thereof. The clamping member 76 is then slid towards the end 88 of the connector until the inwardly turned ends 92 of the legs 80 are beneath shoulders 94 on the sides of the connector. It will be understood that the clamping member 76 can be assembled to the connector 52 while the connector is on the printed circuit board. Alternatively chips can be assembled to a carrier 37 and a connector 52, and the connector then plugged into receptacles in a circuit board for test purposes.

As previously mentioned, a chip carrier 37 can be used for permanent connections to the terminal areas of the chip by bonding the terminal areas to the bumps on the chip. A glass plate 58 and clip 60, as shown, can be used to protect the chip or other protecting means can be provided.

We claim:

1. Electrical contacting means for establishing electrical contact with the terminal areas of an integrated circuit chip, said terminal areas being at precisely predetermined locations on one surface of said chip, said contacting means comprising:

an insulating substrate of molded polymeric material having a flat surface, a plurality of conductors in said substrate, each of said conductors having an upper surface which is coplanar with said flat surface and having a body portion which is beneath, an contained in said substrate, said conductors being of electrodeposited conductive metal, a chip-receiving zone located centrally on said flat surface, each of said conductors having an inner end in said chip-receiving zone, said conductors extending from said chip-receiving zone and having outer end portions which are remote from said chip-receiving zone, and each of said conductors having a contact promontory on its inner end, each of said promontories extending above said upper surface of its respective conductor and having a substantially hemispherical surface, said promontories being precisely located relative to each other at locations corresponding to the locations of said terminal areas, each of said promontories being integrally electrolytically deposited with its respective conductor whereby, upon placement of said one surface of said chip on said promontories with said promontories against said terminal areas of said chip, said conductors are placed in electrical contact with said terminal areas.

2. Electrical contacting means as set forth in claim 1, said contacting means having been produced by the steps of etching hemispherical depressions in unmasked portions of one surface of an etchable metal having masking over the remaining portions of said one surface of the etchable metal, removing said masking along paths corresponding to the paths of said conductors, forming said conductors by electrodepositing etch-resistant metal on said paths and in said depressions, removing the remaining masking from said one surface of the etchable metal, molding said substrate against said one surface of the etchable metal, and then etching away said etchable metal.

3. Electrical contacting means as set forth in claim 1, having clamping means for removably clamping said chip against said promontories.

4. Electrical contacting means as set forth in claim 1, each of said conductors comprising electrodeposited non-precious conductive metal filler sandwiched between thin platings of electrodeposited precious metal, one of said platings of electrodeposited precious metal constituting said upper surfaces of each of said conductors and the surfaces of said promontories.

5. Electrical contacting means as set forth in claim 4, said non-precious conductive metal being nickel, said precious metal being gold.

6. Electrical contacting means as set forth in claim 1, in combination with said chip, said one surface of said chip being against said promontories, and clamping means removably holding said chip against said promontories.

7. Electrical connecting means as set forth in claim 1, in combination with said chip, said one surface of said chip being against, and being bonded to, said promontories.

8. A method of making an electrical contacting means of the type used for establishing electrical contact with the terminal areas of an integrated circuit chip and comprising an insulating substrate, a chip-receiving zone on one surface of said substrate, and conductors on said one surface, said conductors having inner ends which are in said chip-receiving zone, said conductors extending along predetermined paths and having outer end portions which are remote from said zone, said inner ends having promontories thereon for contacting said terminal areas when said chip is placed in said chip-receiving zone with said promontories against said terminal areas, said method comprising the steps of:

coating one surface of an etchable metal with a resist coating, removing said coating at isolated locations on said one surface of the etchable metal which corresponds to the locations of said promontories, contacting said one surface of the etchable metal with an etchant to form substantially hemispherical depressions in said one surface of the etchable metal at said locations, removing said resist coating along paths extending from said depressions and corresponding to the said paths of said conductors, electrodepositing conductive etch-resistant metal on said paths and in said depressions, removing the remaining resist coating from said one surface of the etchable metal, molding insulating material against said one surface of the etchable metal and in enclosing relationship to said electrodeposited conductive metal, and etching away said etchable metal.

* * * * *